United States Patent
Pan

(10) Patent No.: US 8,680,931 B1
(45) Date of Patent: Mar. 25, 2014

(54) PERIODIC SIGNAL GENERATORS HAVING MICROELECTROMECHANICAL RESONATORS THEREIN THAT SUPPORT SURFACE WAVE AND BULK ACOUSTIC WAVE MODES OF OPERATION WITH DIFFERENT TEMPERATURE COEFFICIENTS OF FREQUENCY

(75) Inventor: Wanling Pan, San Jose, CA (US)

(73) Assignee: Integrated Device Technology Inc., San Jose, CA (US)

( * ) Notice: Subject to any disclaimer, the term of this patent is extended or adjusted under 35 U.S.C. 154(b) by 25 days.

(21) Appl. No.: 13/435,817

(22) Filed: Mar. 30, 2012

(51) Int. Cl.
*H03B 5/32* (2006.01)
*H03B 21/00* (2006.01)
*H01L 41/083* (2006.01)
*H01L 41/18* (2006.01)
*H03H 9/205* (2006.01)
*H03H 9/25* (2006.01)

(52) U.S. Cl.
USPC ............ 331/60; 331/41; 331/154; 310/313 B; 310/313 R; 310/315; 310/320; 310/322; 310/334; 333/187; 333/189; 333/191; 333/192; 333/193; 333/197; 333/198

(58) Field of Classification Search
USPC ......... 29/25.35; 310/311, 313 B, 313 R, 315, 310/320, 322, 334, 348, 351, 368; 331/116 FE, 116 M, 116 R, 154, 155, 331/158, 160, 162, 37–43, 60; 333/186–189, 191–194, 197, 198
See application file for complete search history.

(56) References Cited

U.S. PATENT DOCUMENTS

| | | | | |
|---|---|---|---|---|
| 4,634,913 | A * | 1/1987 | Whatmore et al. | 310/313 A |
| 6,300,706 | B1 * | 10/2001 | Grudkowski et al. | 310/334 |
| 6,555,946 | B1 * | 4/2003 | Finder et al. | 310/324 |
| 7,215,214 | B1 * | 5/2007 | Taheri et al. | 331/107 A |
| 2009/0273404 | A1 * | 11/2009 | Hay | 331/107 A |
| 2010/0162815 | A1 * | 7/2010 | Lee | 73/579 |
| 2010/0194246 | A1 * | 8/2010 | Wang et al. | 310/365 |
| 2012/0074818 | A1 * | 3/2012 | Crowley et al. | 310/348 |
| 2012/0154074 | A1 * | 6/2012 | Ruby et al. | 333/187 |

OTHER PUBLICATIONS

Samarao et al., "Combined Capacitive and Piezoelectric Transduction for High Performance Silicon Micoresonators," MEMS 2011, Cancun, Mexico, Jan. 23-27, 2011, pp. 169-172.*
Schodowski, Stanley S.; "Resonator Self-Temperature-Sensing Using a Dual-Harmonic-Mode Crystal Oscillator"; 43$^{rd}$ Annual Symposium on Frequency Control—1989; U.S. Army Electronics Technology and Devices Laboratory, Fort Monmouth, NJ 07703-5000;pp. 2-7.

* cited by examiner

*Primary Examiner* — Levi Gannon
(74) *Attorney, Agent, or Firm* — Myers Bigel et al.

(57) ABSTRACT

A periodic signal generator is configured to generate high frequency signals characterized by relatively low temperature coefficients of frequency (TCF). This generator may include an oscillator containing a pair of equivalent MEMs resonators therein, which are configured to support bulk acoustic wave and surface wave modes of operation at different resonance frequencies. Each resonator includes a stack of layers including a semiconductor resonator body (e.g., Si-body), a piezoelectric layer (e.g., AlN layer) on the resonator body and interdigitated drive and sense electrodes on the piezoelectric layer. The oscillator is configured to support the generation of first and second periodic signals having unequal first and second frequencies ($f_1$, $f_2$) from first and second resonators within the pair. These first and second periodic signals are characterized by respective first and second temperature coefficients of frequency ($TCf_1$, $TCf_2$), which may differ by at least about 10 ppm/° C.

4 Claims, 10 Drawing Sheets

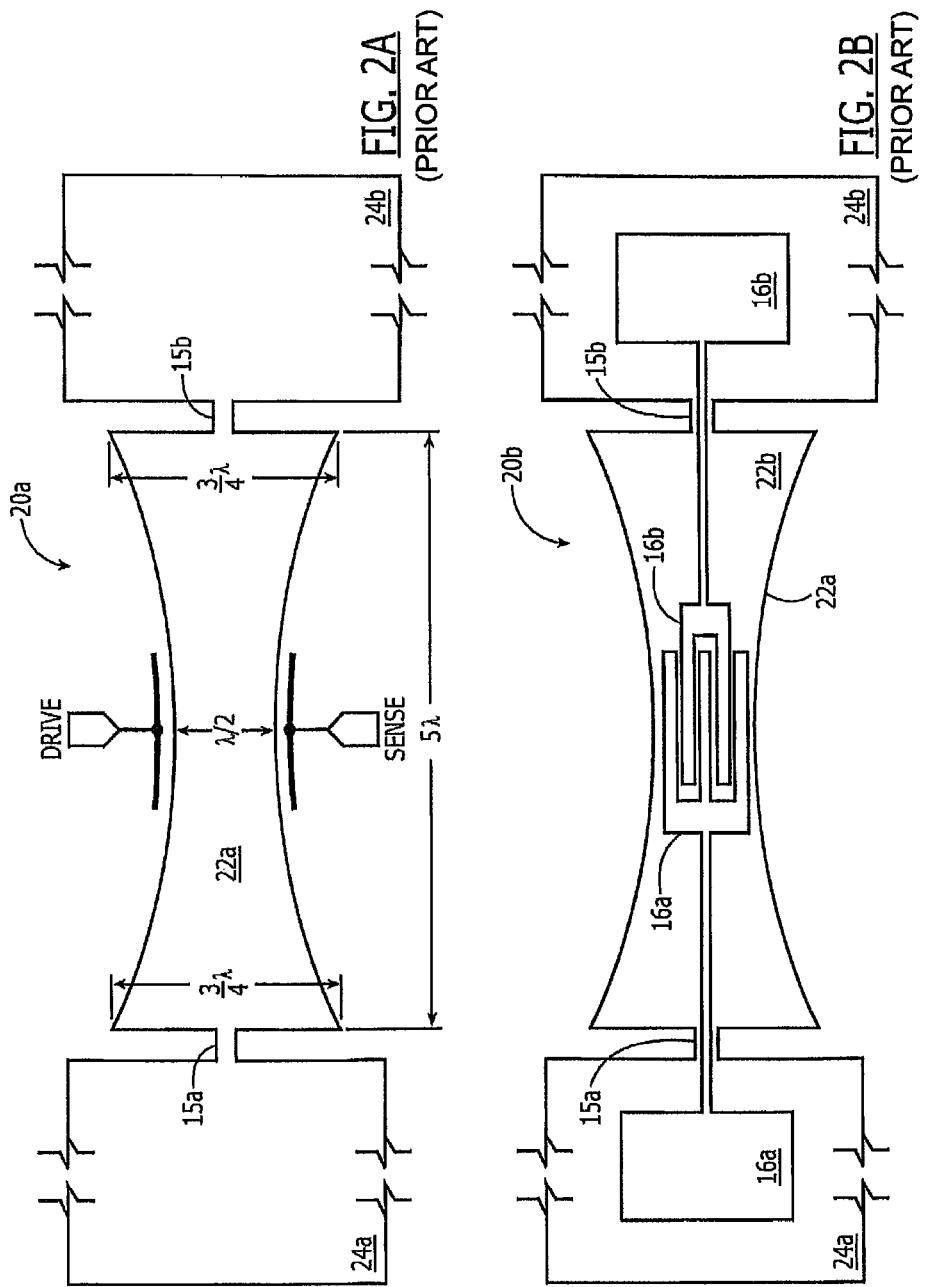

PERIODIC SIGNAL GENERATORS HAVING MICROELECTROMECHANICAL RESONATORS THEREIN THAT SUPPORT SURFACE WAVE AND BULK ACOUSTIC WAVE MODES OF OPERATION WITH DIFFERENT TEMPERATURE COEFFICIENTS OF FREQUENCY

CROSS-REFERENCE TO RELATED APPLICATION

This application is related to commonly-assigned U.S. application Ser. Nos. 13/186,332, filed Jul. 19, 2011 and 12/363,142, filed Jan. 30, 2009, the disclosures of which are hereby incorporated herein by reference.

FIELD OF THE INVENTION

The present invention relates to integrated circuit devices and, more particularly, to microelectromechanical resonator devices.

BACKGROUND OF THE INVENTION

Frequency references provided by oscillators are required in every clocked electronic system, including communication circuits, microprocessors, and signal processing circuits. Oscillators frequently consist of high performance piezoelectric crystals, such as quartz oscillators. The advantages of quartz oscillators are their stable operating frequency and high quality factor. However, the disadvantages of quartz oscillators are their relatively large size and unsuitability for high integration with electronic circuitry (e.g., CMOS circuits).

Based on these limitations of conventional oscillators, there is a strong interest in the development of fully integrated silicon oscillators. Integration is important not only for reduced size but also reduced power consumption. It is possible to realize an integrated silicon oscillator using the mechanical properties of silicon devices. For example, silicon microelectromechanical (MEMS) resonators can provide small form factor, ease of integration with conventional semiconductor fabrication techniques and high f·Q products. High frequency and high-Q width-extensional mode silicon bulk acoustic resonators (SiBARs) and film bulk acoustic wave resonators (FBARs) have demonstrated atmospheric quality factors (Q) in excess of 10,000 at or above 100 MHz, with moderate motional resistances. Such resonators are disclosed in an article by S. Pourkamali et al., entitled "Low-Impedance VHF and UHF Capacitive Silicon Bulk Acoustic Wave Resonators—Part I: Concept and Fabrication," IEEE Trans. On Electron Devices, Vol. 54, No. 8, pp. 2017-2023, August (2007), the disclosure of which is hereby incorporated herein by reference.

Unfortunately, such resonators may be characterized by relatively high temperature coefficient of frequency (TCF) values that require active compensation using temperature compensation circuits and/or relatively complex fabrication techniques to reduce TCF. Circuit-based compensation techniques typically increase the complexity of a resonator device and increase power consumption. Alternatively, fabrication-based compensation techniques that reduce TCF may cause a reduction in resonator quality factor (Q) and/or increase in resonator insertion loss. Examples of resonators that may use active and/or passive temperature compensation techniques are disclosed in U.S. Pat. Nos. 7,800,282, 7,843,284, 7,888,843, 7,924,119, 7,939,990, 7,955,885, 8,022,779, 8,061,013, 8,063,720 and 8,106,724, the disclosures of which are hereby incorporated herein by reference.

SUMMARY OF THE INVENTION

A periodic signal generator according to embodiments of the present invention is configured to generate high frequency signals characterized by relatively low temperature coefficients of frequency (TCF). According to some of these embodiments of the invention, a microelectromechanical resonator may be engineered as a dual mode signal generator that produces two periodic signals having unequal resonant frequencies with substantially different temperature coefficients of frequency. Circuitry is also provided for combining the two periodic signals using a mixer to thereby yield a high frequency low-TCF periodic difference signal at an output of the periodic signal generator.

According to some of these embodiments of the invention, a periodic signal generator includes an oscillator containing a pair of equivalent microelectromechanical resonators therein, which are both configured to support bulk acoustic wave and surface wave modes of operation at different resonance frequencies. Each resonator includes a stack of layers including a semiconductor resonator body (e.g., Si-body), a piezoelectric layer (e.g., AlN layer) on the resonator body and inter-digitated drive and sense electrodes on the piezoelectric layer. The oscillator is configured to support the generation of first and second periodic signals having unequal first and second frequencies ($f_1$, $f_2$) from first and second resonators within the pair. These first and second periodic signals are characterized by respective first and second temperature coefficients of frequency ($TCf_1$, $TCf_2$), which may differ by at least about 10 ppm/° C. A resonant mode separation layer may also be provided, which may extend between the piezoelectric layer and the resonator body. This mode separation layer can be formed of a material having a temperature coefficient of frequency that is unequal to a temperature coefficient of frequency of the piezoelectric layer and unequal to a temperature coefficient of frequency of the resonator body. In particular, the mode separation layer is preferably formed of a material (e.g., $SiO_2$) that provides a temperature compensating effect to the resonator by having an opposite TCF relative to the piezoelectric layer and the resonator body. Moreover, to achieve a relatively high second frequency ($f_2$), a pitch between each of the fingers in the interdigitated drive and sense electrodes is less than a thickness of the resonator body or less than one-half a total thickness of the composite of layers that make up the resonator. These layers may include a bottom electrode, which extends between the piezoelectric layer and the resonator body.

According to further embodiments of the invention, a frequency multiplier is provided, which is responsive to the first periodic signal. This frequency multiplier is configured to generate a periodic output signal having a frequency equal to N times a frequency of the first periodic signal, where N is a real number greater than one. A mixer circuit is also provided, which is configured to generate a periodic beat signal in response to the second periodic signal and the periodic output signal. This periodic beat signal has a frequency $f_b$ equal to $|f_2 - Nf_1|$ and a temperature coefficient of frequency ($TCf_b$) of less than a smaller of $TCf_1$ and $TCf_2$.

A periodic signal generator according to further embodiments of the invention includes an oscillator containing at least one microelectromechanical resonator, which is configured to support bulk acoustic wave and surface wave modes of operation at different resonance frequencies. The resonator includes a stack of layers, such as a semiconductor resonator body layer, an electrically insulating temperature compensation layer on the resonator body, a piezoelectric layer on the temperature compensation layer and interdigitated drive and sense electrodes on the piezoelectric layer. This oscillator is configured to generate first and second periodic signals having unequal first and second frequencies ($f_1$, $f_2$). The first and second periodic signals are characterized by respective first and second temperature coefficients of frequency ($TCf_1$, $TCf_2$) that differ by at least about 5 ppm/° C. A frequency multiplier is provided, which is responsive to the first periodic signal. The frequency multiplier is configured to generate a periodic output signal having a frequency equal to N times a frequency of the first periodic signal, where N is a real number greater than one. A mixer circuit is provided, which is configured to generate a periodic beat signal in response to the second periodic signal and the periodic output signal. The periodic beat signal has a frequency $f_b$ equal to $|f_2-Nf_1|$ and a temperature coefficient of frequency ($TCf_b$) of less than a smaller of $TCf_1$ and $TCf_2$. In particular, the mixer circuit may be configured so that $TCf_b$ is equal to $TCf_1+\mu_f(TCf_2-TCf_1)$, where $\mu_f=f_2/f_b$. The mixer circuit may also include a low pass filter configured to pass the periodic beat signal. According to further aspects of these embodiments of the invention, a thickness of the temperature compensation layer may be sufficient to yield a $TCf_2$ of less than about 2 ppm/° C. when the resonator is supporting the surface wave mode of operation.

BRIEF DESCRIPTION OF THE DRAWINGS

FIG. 2A is a plan view of a concave bulk acoustic resonator (CBAR) according to the prior art.

FIG. 2B is a plan view of a concave bulk acoustic resonator (CBAR) according to the prior art.

DETAILED DESCRIPTION OF EMBODIMENTS

Figure 1:
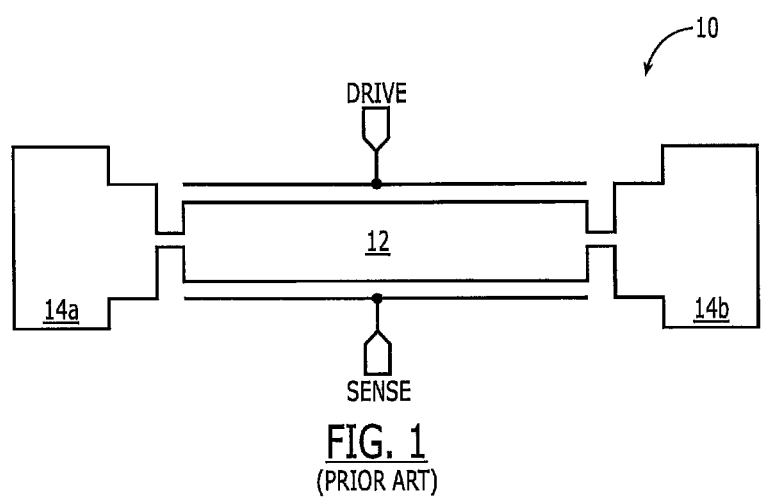
FIG. 1 is a plan view of a silicon bulk acoustic resonator (SiBAR) according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 2A illustrates a capacitive-type concave bulk acoustic resonator (CBAR) 20a having resonator body 22a (e.g., silicon) that is suspended opposite a recess (not shown) within a substrate 24a, 24b by a pair of opposing supports/anchors 15a, 15b located at opposite ends of the resonator body 22a. In contrast to the conventional bulk acoustic resonator 10 of FIG. 1, which includes a rectangular-shaped resonator body 12 suspended opposite a recess (not shown) in a substrate 14a, 14b, the CBAR 20a includes opposing concave-shaped sides. These sides curve inward relative to each other so that a minimum spacing at a center of the resonator body 22a is $\lambda/2$, where $\lambda$ is a wavelength associated with a resonant frequency of the resonator body 22a.

As further illustrated by FIG. 2A, a drive electrode (DRIVE) extends adjacent the first concave-shaped side of the resonator body 22a and a sense electrode (SENSE) extends adjacent a second concave-shaped side of the resonator body 22a. In contrast to the resonator 10 of FIG. 1, the width of the drive electrode (and sense electrode) as measured along the first concave-shaped side of the resonator body 22a is less than a spacing ($5\lambda$) between the first and second ends of the resonator body 22a. In particular, the width of the drive electrode as measured along the first concave-shaped side is preferably less than one-half a spacing between the first and second ends of the resonator body 22a and, more preferably, less than one-third a spacing between the first and second ends of the resonator body 22a.

Moreover, when the widths of the first and second ends of the resonator body 22a are equal to $3\lambda/4$, as illustrated by FIG. 2A, the opposing ends will not support acoustic energy at the resonant frequency determined by the central width $\lambda/2$. Accordingly, because of the concave shape of the sides extending adjacent the drive and sense electrodes, the resonator 20a operates to concentrate acoustic energy near the central width $\lambda/2$ of the resonator body 22a and thereby supports a high quality (Q) of the resonator 20a by reducing acoustic losses at the relatively narrow supports 15a, 15b.

Figure 2C:
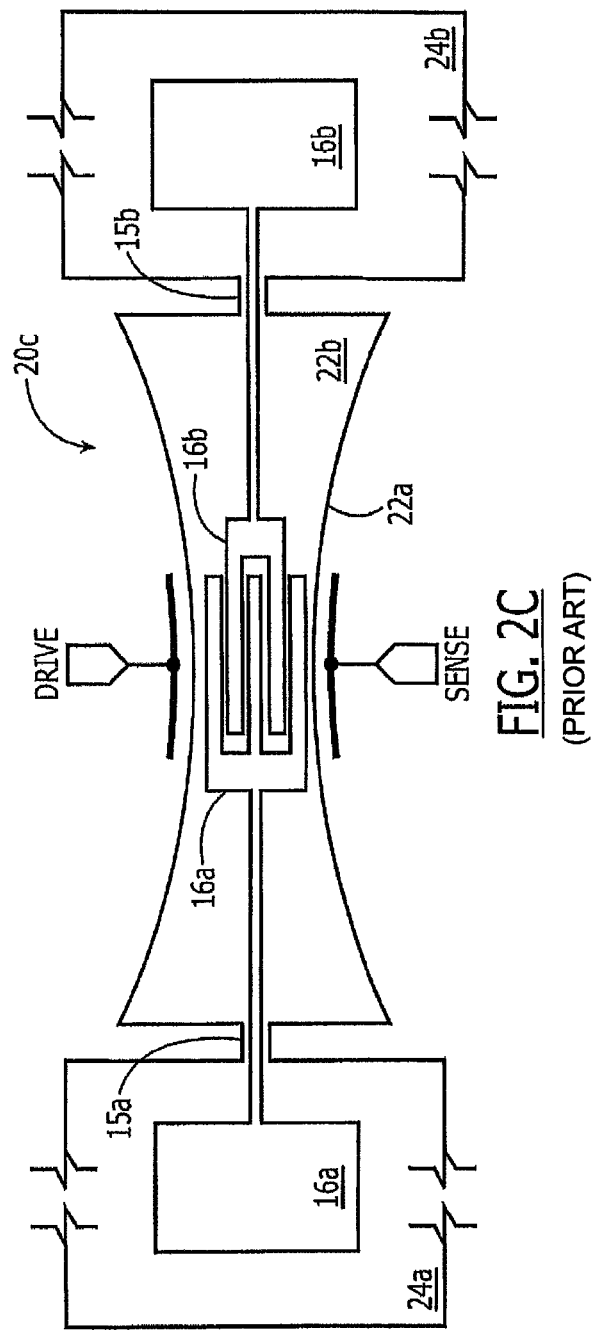
FIG. 2C is a plan view of a capacitively and piezoelectrically transduced concave bulk acoustic resonator (CP-CBAR) according to the prior art.

The concave-shaped resonator body 22a of the capacitive-type resonator 20a of FIG. 2A may be utilized within a piezoelectric-type resonator 20b of FIG. 2B. This resonator 20b is illustrated as including a piezoelectric layer 22b (e.g., ZnO) on a resonator body 22a (e.g., silicon) and first and second interdigitated electrodes 16a, 16b on the piezoelectric layer 22b. These electrodes 16a and 16b are patterned to include a plurality of finger-like extensions that operate to concentrate acoustic energy near the center of the resonator body 22a. As illustrated by FIG. 2C, the embodiments of FIGS. 2A and 2B may be combined to yield a concave bulk acoustic resonator (CBAR) 20c that supports both capacitive and piezoelectric transduction using electrostatic drive and sense electrodes and interdigitated electrodes 16a, 16b.

Figure 3:
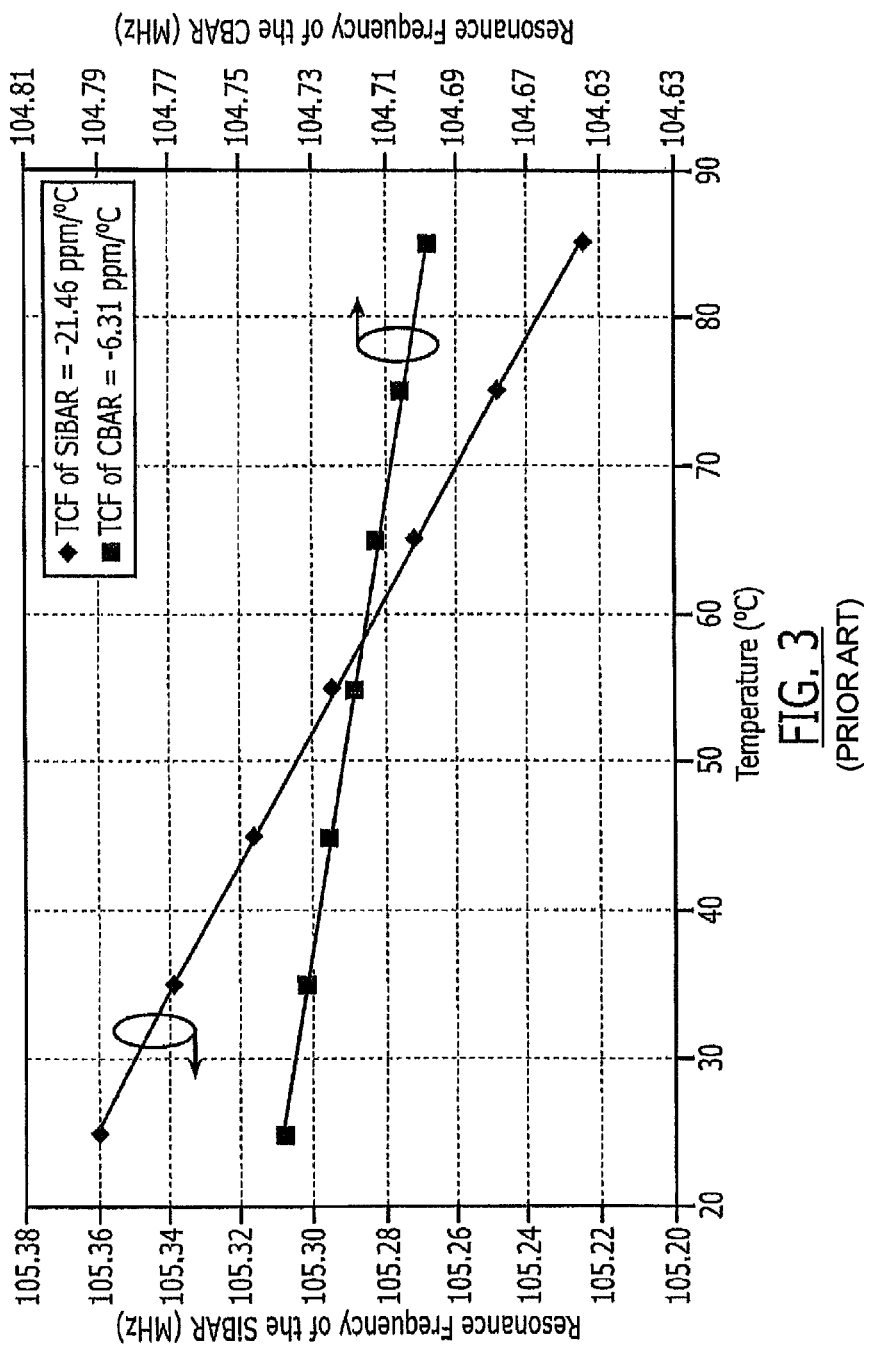
FIG. 3 includes a first graph of resonance frequency of the SiBAR of FIG. 1 versus temperature and a second graph of resonance frequency of the concave SiBAR of FIG. 2A versus temperature.
Figure 4:
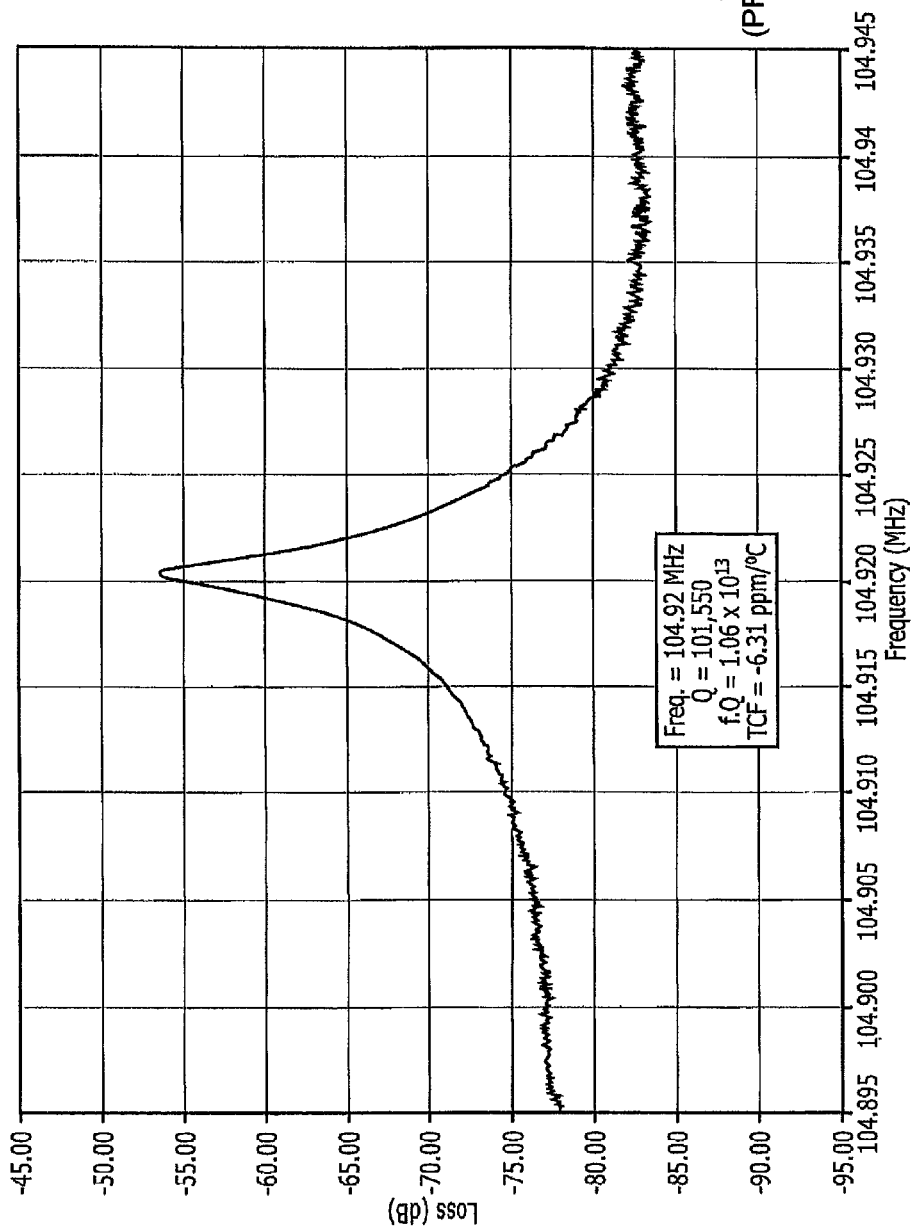
FIG. 4 is a graph that illustrates loss (dB) versus frequency for the CBAR of FIG. 2A (in vacuum).

A comparison of the TCF characteristics of the SiBAR of FIG. 1 versus the TCF characteristics of the CBAR of FIG. 2A is provided by FIG. 3. As illustrated by FIG. 3, a 100 MHz CBAR of FIG. 2A may exhibit a TCF of −6.31 ppm/° C., which is significantly lower than the TCF of −21.46 ppm/° C. of an otherwise equivalent 100 MHz SiBAR having a rectangular-shaped resonator body. These resonators were fabricated on the same boron-doped p-type silicon with a starting resistivity of about 0.001 Ω-cm. As illustrated by FIG. 4, the measured response of the CBAR in vacuum demonstrates a Q of 101,550 at 104.92 MHz and an fQ product of $1.06 \times 10^{13}$.

One example of the CBAR 20c of FIG. 2C is more fully described in an article by Samarao et al., entitled 'Combined Capacitive and Piezoelectric Transduction for High Performance Silicon Microresonators," MEMS 2011, Cancun, Mexico, Jan. 23-27 (2011), pp. 169-172, the disclosure of which is hereby incorporated herein by reference. As illustrated by the graph of FIG. 5B herein, which is taken from FIG. 9a of the Samarao et al. article, a geometrically engineered CP-CBAR may be operated in: (1) a capacitive-drive and capacitive-sense mode using a 20 Volt polarization voltage (Vp) (e.g., by removing a piezoelectric stack from the concave resonator body); (2) a piezoelectric-drive and piezoelectric-sense mode; (3) a capacitive/piezoelectric-drive and capacitive/piezoelectric-sense mode; and (4) a capacitive-drive and piezoelectric-sense mode. As evident by this graph, the third mode (3) demonstrates highly efficient resonance at multiple frequencies, with reduced acoustic losses caused by spurious signal generation relative to mode (2). In particular, the third mode (3) produces two peak signals between 98 and 102 MHz, which have temperature coefficients of frequency that differ by 10 ppm/° C.

The experimental configurations of these modes are more fully illustrated by FIGS. 3c and 6 of the Samarao et al. article and in a dissertation by Ashwin K. Samarao, entitled "Compensation and Trimming for Silicon Micromechanical Resonators and Resonator Arrays for Timing and Spectral Processing," Dissertation Presented to the Academic Faculty, Georgia Institute of Technology, May 2011, published in depository archives on Jul. 6, 2011, pp. 1-132, the disclosures of which are hereby incorporated herein by reference.

Figure 5A:
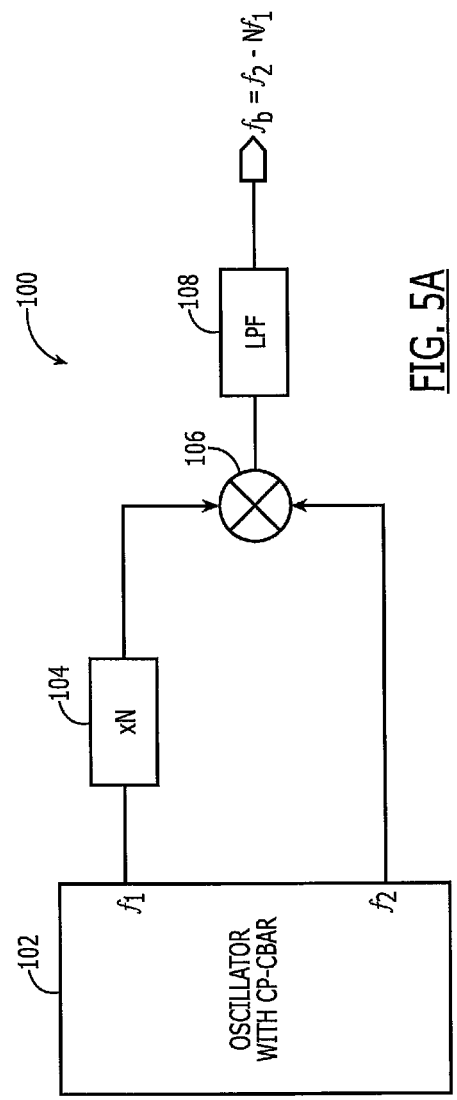
FIG. 5A is a block diagram of a periodic signal generator according to an embodiment of the present invention.
Figure 5B:
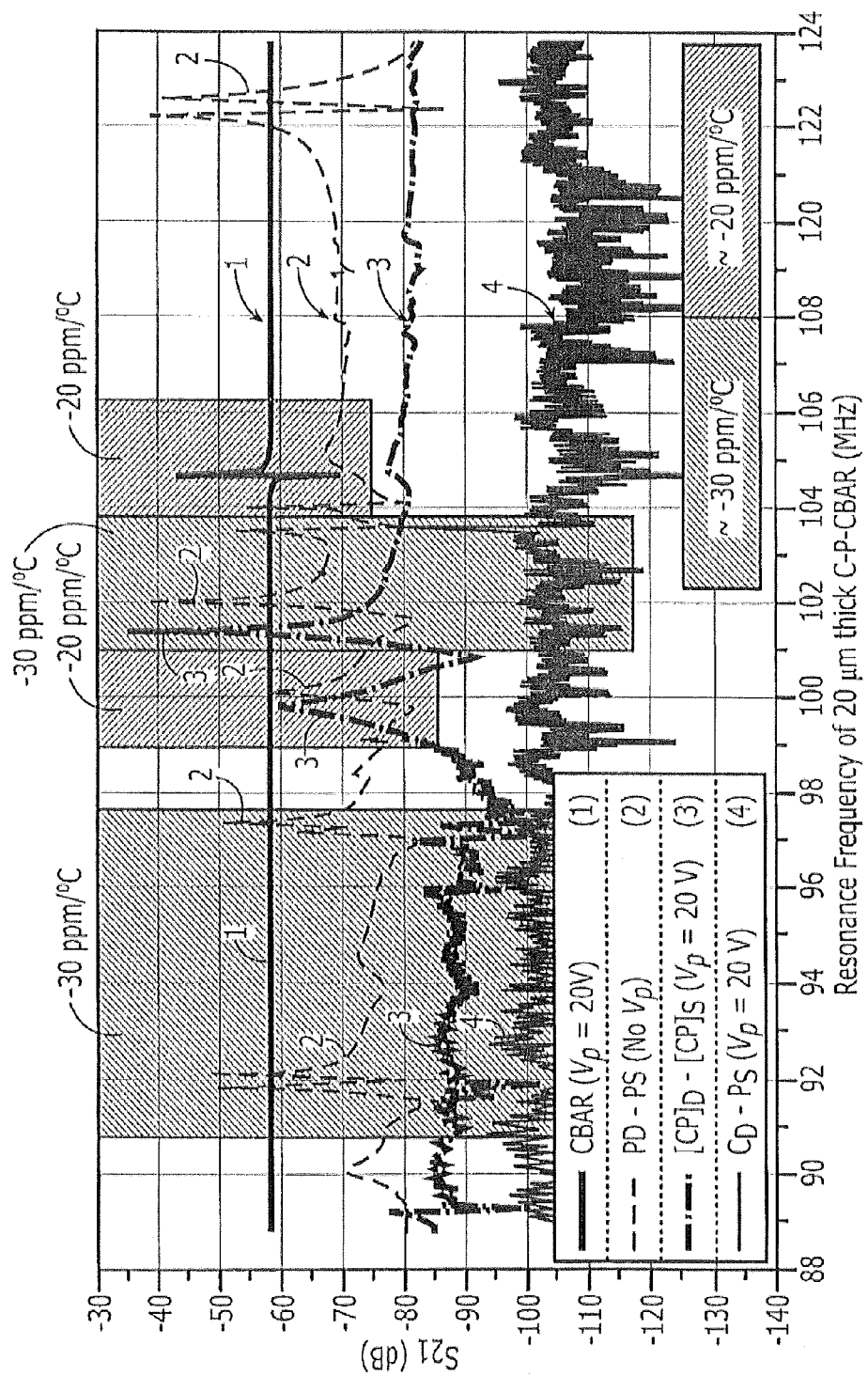
FIG. 5B is a graph illustrating resonant frequencies of a 20 um thick capacitively and piezoelectrically transduced concave bulk acoustic resonator (CBAR) when configured for: (1) capacitive drive and capacitive sense with a 20 Volt polarization voltage (without piezoelectric stack); (2) piezoelectric drive and piezoelectric sense without polarization voltage; (3) capacitive/piezoelectric drive and capacitive/piezoelectric sense with a 20 Volt polarization voltage; and (4) capacitive drive and piezoelectric sense with a 20 Volt polarization voltage.

As highlighted by FIG. 5A, a geometrically engineered resonator may be configured to yield multiple spaced-apart resonant frequency signals having substantially different temperature coefficients of frequency (e.g., −20 ppm/° C. and −30 ppm/° C.) when operating in at least one of the aforementioned modes. These aspects of the CP-CBAR of FIG. 2C (and FIG. 3c of the Samarao et al. article) may be utilized within a periodic signal generator 100 containing an oscillator 102, which is configured to produce first and second periodic signals ($f_1$ and $f_2$) having unequal frequencies with unequal TCFs. The first periodic signal $f_1$ is provided to a multiplier circuit 104, which passes its output to a mixer circuit. This mixer circuit contains a mixer 106, which receives the output of the multiplier circuit 104 and the second periodic signal $f_2$, and a low pass filter 108. The multiplier circuit 104 and mixer circuit collectively form one embodiment of a signal processor that is responsive to the first and second periodic signals.

As will be understood by those skilled in the art, a difference signal generated at an output of the mixer 106 may be passed through a low pass filter 108 to thereby yield a beat signal $f_b$ having a frequency equal to $|f_2 - Nf_1|$ and a temperature coefficient of frequency $TCf_b$ equal to $TCf_1 + \mu_f(TCf_2 -$ TCf$_1$), where $\mu_f$=f$_2$/f$_b$. According to additional embodiments of the invention, the generation of the beat signal f$_b$ may be used in applications relating to temperature sensing, such as those disclosed in an article by S. Schodowski entitled "Resonator Self-Temperature-Sensing Using a Dual-Harmonic-Mode Crystal Oscillator," 43$^{rd}$ Annual Symposium of Frequency Control, pp. 2-7 (1989).

Figure 5C:
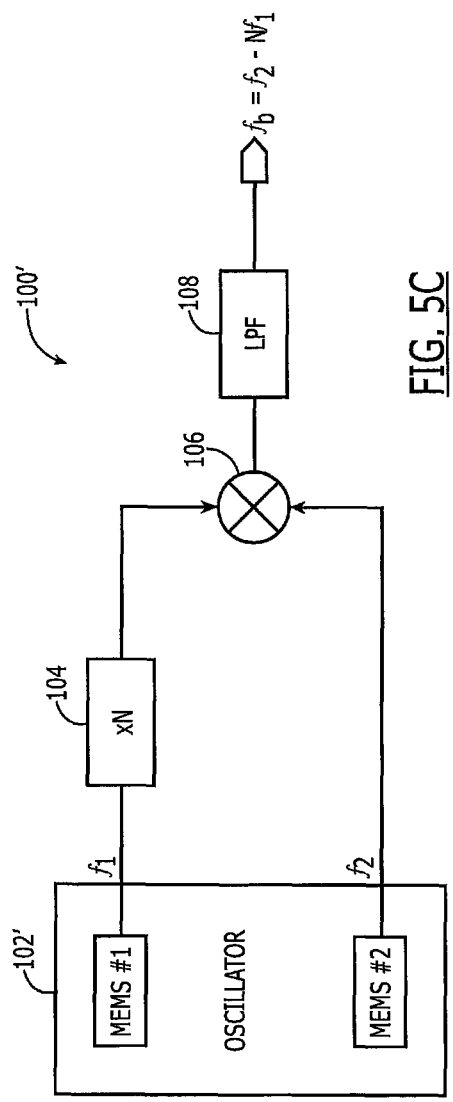
FIG. 5C is a block diagram of a periodic signal generator according to an additional embodiment of the present invention.

Alternatively, as illustrated by FIG. 5C, a periodic signal generator 100' may be provided, which contains an oscillator 102' having multiple MEMs resonators (MEMS #1, MEMS #2) therein. These resonators, which may be identical, are configured to produce respective first and second periodic signals (f$_1$ and f$_2$) having unequal frequencies with unequal TCFs. The first periodic signal f$_1$ is provided to a multiplier circuit 104, which passes its output to a mixer circuit. This mixer circuit contains a mixer 106, which receives the output of the multiplier circuit 104 and the second periodic signal f$_2$, and a low pass filter 108. As will be understood by those skilled in the art, a difference signal generated at an output of the mixer 106 may be passed through a low pass filter 108 to thereby yield a beat signal f$_b$ having a frequency equal to |f$_2$−Nf$_1$| and a temperature coefficient of frequency TCf$_b$ equal to TCf$_1$+$\mu_f$(TCf$_2$−TCf$_1$), where $\mu_f$=f$_2$/f$_b$.

Figure 5D:
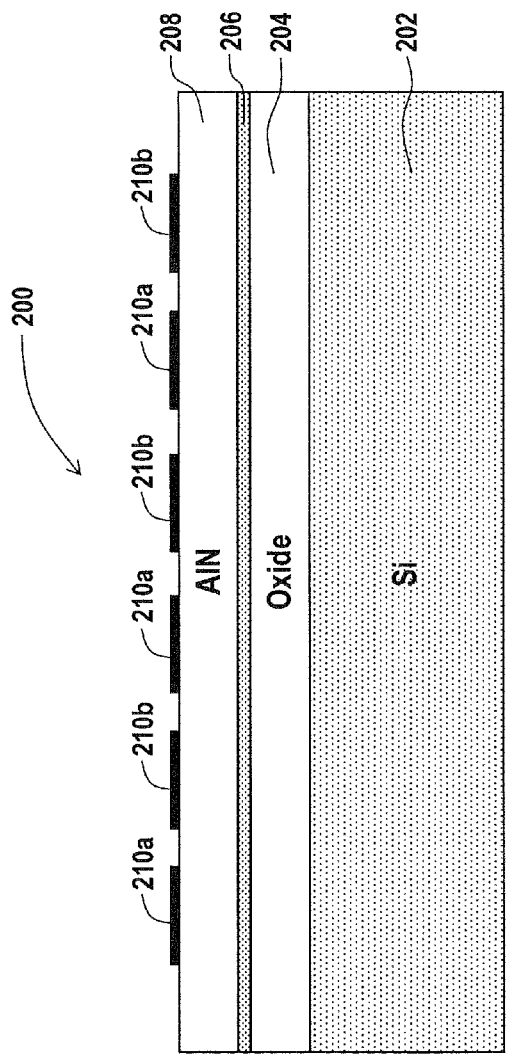
FIG. 5D is a cross-sectional view of a multi-mode resonator that may be utilized in the periodic signal generator of FIG. 5C, according to embodiments of the present invention.

Referring now to FIG. 5D, the MEMs resonators within the oscillator 102' of FIG. 5C may be configured as equivalent rectangular-shaped multi-mode resonators. These resonators may be independently controlled by circuitry to support both bulk acoustic wave and surface wave modes of operation at different resonance frequencies f$_2$ and with different temperature coefficients of frequency TCf$_1$, TCf$_2$, which may differ by at least about 5 ppm/° C. and, more preferably, by at least about 10 ppm/° C. As illustrated, the resonator 200 of FIG. 5D includes a semiconductor resonator body 202 (e.g., silicon body), a mode separation layer 204 on the resonator body 202, a bottom electrode 206 on the mode separation layer 204, a piezoelectric layer 208 (e.g., AlN layer) on the bottom electrode 206 and drive and sense electrodes 210a, 210b (e.g., molybdenum) with interdigitated fingers on the piezoelectric layer 208. A pitch between each of the fingers in the interdigitated drive and sense electrodes may be less than a thickness of the resonator body 202 and/or less than one-half a total thickness of the resonator 200. As will be understood by those skilled in the art and illustrated by FIGS. 2 and 4A of the aforementioned U.S. Pat. No. 7,800,282 and FIG. 2A of the aforementioned U.S. Pat. No. 7,843,284, this resonator 200 may be suspended opposite a recess within a semiconductor substrate using at least one pair of tethers.

According to some embodiments of the invention, the mode separation layer 204 includes a material having a temperature coefficient of frequency that is unequal to a temperature coefficient of frequency of the piezoelectric layer 208 and unequal to a temperature coefficient of frequency of the resonator body 202. For example, the mode separation layer 204 may be formed of a material such as silicon dioxide, which provides an additional temperature compensating effect to the resonator 200 by having an opposite TCF relative to the piezoelectric layer 208 and the resonator body 202. According to additional embodiments of the invention, the use of an upper oxide-based mode separation layer 204, which extends between an upper surface of the resonator body 202 and the piezoelectric layer 208, may have a significantly larger effect on the TCF associated with surface mode operation relative to the TCF associated with bulk mode operation. Moreover, the mode separation layer 204 may have a thickness sufficient to facilitate a relatively high-Q surface wave mode of operation adjacent an upper surface of the resonator 200 and may even provide sufficient temperature compensation to yield a TCF of less than about 2 ppm/° C. when the resonator is supporting the surface wave mode of operation. The use of an electrically insulating layer to provide bulk temperature compensation in a MEMs resonator is more fully described in commonly-assigned U.S. application Ser. No. 13/035,148 to Pan entitled "Methods of Forming Micro-Electromechanical Resonators Using Passive Temperature Compensation Techniques," filed Feb. 25, 2011 and Ser. No. 12/363,142 to Wang et al. entitled "Thin-Film Bulk Acoustic Resonators Having Reduced Susceptibility to Process-Induced Material Thickness Variations," filed Jan. 30, 2009, the disclosures of which are hereby incorporated herein by reference.

Figures 6A, 6B:
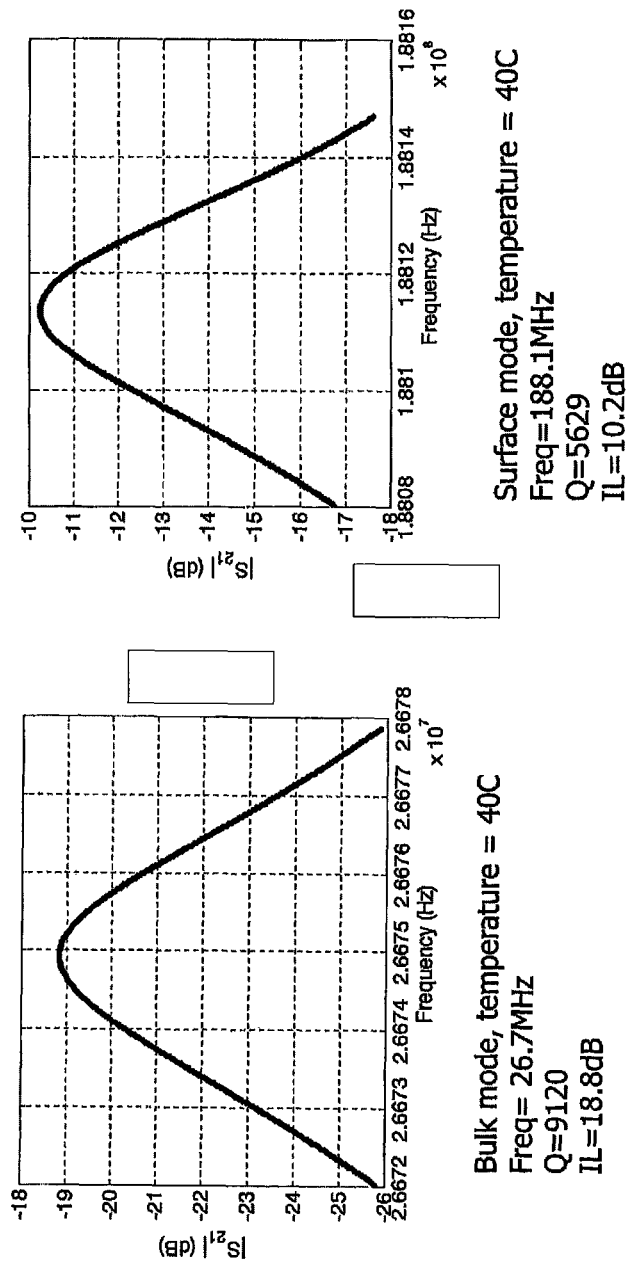
FIGS. 6A-6B are graphs that illustrate loss (dB) versus measured frequency of a resonator when operating at resonance in a bulk acoustic wave mode of operation (FIG. 6A) and in a surface wave mode of operation (FIG. 6B), in vacuum at 40° C., according to embodiments of the invention.

FIGS. 6A-6B illustrate resonance frequencies of a resonator embodiment having six pairs of fingers associated with the drive and second electrodes 210a, 210b, a finger-to-finger pitch of 13 μm, a finger spacing of 4 μm, an oxide mode separation layer 204 (grown oxide layer) having a thickness of 2 μm and a resonator body 202 having a thickness of about 29 μm, a length of 234 μm and a width of 156 μm. The bottom electrode 206, piezoelectric layer 208 and drive and sense electrodes 210a, 210b may be formed as a Mo/AlN/Mo stack having a thickness of 50/700/50 nm. As shown by FIGS. 6A-6B, the measured frequency of resonance of the resonator when driven to operate in bulk mode of operation is f$_1$=26.7 MHz with a TCf$_1$ of −21.9 ppm/° C. (with an insertion loss IL=18.8 dB and Q=9120) and the frequency of resonance of the same resonator when driven to operate in a surface mode of operation is f$_2$=188.1 MHz with a TCf$_2$ of −12.2 ppm/° C. (with an insertion loss IL=10.2 dB and Q=5629).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A periodic signal generator, comprising:
an oscillator comprising first and second equivalent microelectromechanical resonators configured to support bulk acoustic wave and surface wave modes of operation, respectively, said first and second resonators each comprising a respective stack of layers including a semiconductor resonator body, an electrically insulating mode separation layer on the resonator body, a piezoelectric layer on the mode separation layer and interdigitated drive and sense electrodes on the piezoelectric layer, said first and second equivalent microelectromechanical resonators configured to generate first and second periodic signals having unequal first and second frequencies (f$_1$, f$_2$), respectively, said first and second periodic signals characterized by respective first and second temperature coefficients of frequency (TCf$_1$, TCf$_2$) that differ by greater than 10 ppm/° C., where the mode separation layer comprises a material that is sufficiently thick that TCf$_2$ is less than about 2 ppm/° C. when the second resonator is supporting the surface wave mode of operation at the second frequency f$_2$ and the first resonator is concurrently supporting the bulk acoustic wave mode of operation at the first frequency f$_1$;
a frequency multiplier responsive to the first periodic signal, said frequency multiplier configured to generate a periodic output signal having a frequency equal to N times a frequency of the first periodic signal, where N is a real number greater than one; and
a mixer circuit configured to generate a periodic beat signal in response to the second periodic signal and the periodic output signal, said periodic beat signal having a frequency $f_b$ equal to $|f_2-Nf_1|$ and a temperature coefficient of frequency ($TCf_b$) of less than a smaller of $TCf_1$ and $TCf_2$.

2. The generator of claim 1, wherein a pitch between each of the fingers in the interdigitated drive and sense electrodes is less than a thickness of the resonator body.

3. The generator of claim 1, wherein:

$$TCf_b = TCf_1 + \mu_f(TCf_2 - TCf_1),$$

where $\mu_f = f_2/f_b$.

4. A periodic signal generator, comprising:

an oscillator comprising first and second equivalent microelectromechanical resonators configured to support bulk acoustic wave and surface wave modes of operation, respectively, said first and second resonators each comprising a respective stack of layers including a semiconductor resonator body, an electrically insulating mode separation layer on the resonator body, a piezoelectric layer on the mode separation layer and interdigitated drive and sense electrodes on the piezoelectric layer, said first and second equivalent microelectromechanical resonators configured to generate first and second periodic signals having unequal first and second frequencies ($f_1$, $f_2$), respectively, said first and second periodic signals characterized by respective first and second temperature coefficients of frequency ($TCf_1$, $TCf_2$) that differ by greater than 10 ppm/° C., where the mode separation layer comprises a material that is sufficiently thick that $TCf_2$ is less than $TCf_1$ when the second resonator is supporting the surface wave mode of operation at the second frequency $f_2$ and the first resonator is concurrently supporting the bulk acoustic wave mode of operation at the first frequency $f_1$;

a frequency multiplier responsive to the first periodic signal, said frequency multiplier configured to generate a periodic output signal having a frequency equal to N times a frequency of the first periodic signal, where N is a real number greater than one; and a mixer circuit configured to generate a periodic beat signal in response to the second periodic signal and the periodic output signal, said periodic beat signal having a frequency $f_b$ equal to $|f_2-Nf_1|$ and a temperature coefficient of frequency ($TCf_b$) of less than a smaller of $TCf_1$ and $TCf_2$.

* * * * *